United States Patent
Tan et al.

(10) Patent No.: US 7,468,615 B1
(45) Date of Patent: Dec. 23, 2008

(54) VOLTAGE LEVEL SHIFTER

(75) Inventors: Jian Tan, Fremont, CA (US); Qi Zhang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/729,201

(22) Filed: Mar. 28, 2007

(51) Int. Cl.
*H03K 19/094* (2006.01)
*H03K 19/0175* (2006.01)
*H03L 5/00* (2006.01)

(52) U.S. Cl. .................................. 326/68; 327/333
(58) Field of Classification Search ............ 326/62, 326/63, 68, 80, 82, 83, 86, 87, 112, 115, 326/126, 127; 327/108, 109, 333
See application file for complete search history.

(56) References Cited

U.S. PATENT DOCUMENTS

| | | | |
|---|---|---|---|
| 6,556,061 B1 * | 4/2003 | Chen et al. | 327/333 |
| 7,053,656 B2 * | 5/2006 | Seo | 326/68 |
| 7,183,804 B2 * | 2/2007 | Icking et al. | 326/86 |
| 7,199,617 B1 * | 4/2007 | Schrom et al. | 326/86 |
| 2004/0061525 A1 * | 4/2004 | Tamaki | 326/81 |
| 2004/0070421 A1 * | 4/2004 | Kapoor | 326/38 |

OTHER PUBLICATIONS

Samad, Maheen A., "Voltage Level Shifter Using Current Mirroring", U.S. Appl. No. 10/401,381, filed Mar. 27, 2003, pp. 1-23; available from Xilinx, Inc., 2100 Logic Drive, San Jose, CA 95124.

* cited by examiner

*Primary Examiner*—Rexford Barnie
*Assistant Examiner*—Dylan White
(74) *Attorney, Agent, or Firm*—Justin Liu; Lois D. Cartier; LeRoy D. Maunu

(57) ABSTRACT

A high-speed, area-efficient level shifter includes transistors having a variety of oxide thicknesses. The level shifter has a protection circuit stage, and a current mirror stage that allows the level shifter to perform over a wide voltage range at a high frequency. The level shifter maintains rise time, fall time, and duty cycle over a wide range of input and output voltage levels.

16 Claims, 5 Drawing Sheets

VOLTAGE LEVEL SHIFTER

FIELD OF THE INVENTION

The invention relates to integrated circuits (ICs), and more particularly, to voltage level shifter circuits in ICs.

BACKGROUND OF THE INVENTION

Integrated circuits (ICs) which operate in two or more power supply voltages environment invariably require signals to interface between circuits supplied by different power supply voltages. One of the challenges in designing ICs is to accommodate several different power supply voltages on a single IC. Typically, an IC will have an internal or a core supply voltage used for powering the bulk of its internal circuitry. The voltage level of the internal supply is usually kept as low as possible in order to minimize power consumption and in some examples, to adhere to process node requirements. As IC fabrication processes continue to shrink the feature size of transistors, the ICs will continue to decrease in size, and therefore the allowable internal power supply voltage also decreases. For example, ICs fabricated using 90 nm processes can typically operate at approximately 1.2V, and future smaller processes can further lower the operating voltages.

For particular applications, an IC can be integrated with other ICs on an integrated circuit board (PCB). The ICs may have different operating voltages; therefore, it may be a requirement to use more than one power supply voltage setting in order to accommodate the various operating conditions of the ICs. For example, an IC may need to communicate with other elements and/or ICs in a system using an input/output (I/O) standard that requires a higher or a lower voltage level. In general, the low internal voltage of the IC may be electrically separated from the high I/O voltage. Therefore, the internal core circuits and I/O circuits may be coupled to their respective power supplies.

In another example, an IC may have multiple internal core circuits that may require separate power supply voltages in order to function properly. For instance, certain types of memory circuits require a high voltage (e.g., 12.0V). An IC which includes such memory circuits can use a separate high power supply voltage to operate the memory circuits properly. The circuits that use the higher power supply voltage and the circuits that use other supply voltages can communicate with each other using a level shifter. A level shifter is a type of circuit that translates logical signals of one voltage level to logical signals of another voltage level.

There are many other examples of applications that require the use of multiple voltage levels. In such applications, level shifters are necessary and may be used to communicate between two sections of an IC having different power supply voltages.

A problem with prior art level shifters is that their performance can be highly dependent on certain factors, including I/O signals voltage levels, power supplies voltage ranges, and the I/O operating frequencies. These factors may have a significant adverse effect on the performance of the level shifter, especially in a low voltage, and high-speed designs.

Therefore, the need exists for a high-speed, wide voltage range, and area efficient level-shifter that can tolerate variations in the power supply voltages and the I/O operating frequencies. In such instances, it would be advantageous to have a single level shifter circuit that is insensitive to the ranges of the power supply voltages, and the I/O operating frequencies, therefore maintaining optimized performance across wide range of applications and designs.

SUMMARY OF THE INVENTION

In accordance with embodiments of the present invention, a level shifter circuit includes a protection stage, a current mirror stage, and an input stage which may be coupled to input controls. The level shifter can maintain performance over wide range of power supplies voltages and I/O operating frequencies. The protection stage may be coupled between the current mirror stage and the input stage. The protection stage can isolate transistors receiving input signals at low voltage ranges from transistors driving output signals at high voltage ranges. A capacitor may be coupled between the input stage and a branch of the current mirror stage that may allow the level shifter to maintain performance at high frequencies.

In another embodiment of the present invention, an IC including a level shifter, where the IC may be a programmable logic device (PLD) including a level shifter. The level shifter may include a current mirror circuit powered by a high voltage supply, a differential input circuit, and a protection circuit coupled between the current mirror circuit and the differential input circuit. The level shifter of the PLD may also have input terminals coupled to low voltage range input signals, and at least one output terminal coupled to a high voltage range output signal. In an example, the level shifter of the PLD may include a disable terminal that can be used in power-down and/or low-power mode operation of the PLD.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems and integrated circuits (ICs). While the present invention is not so limited, an appreciation of the present invention is presented by way of specific examples. In the following description, numerous specific details are set forth to provide a more thorough understanding of the present invention. However, it will be apparent to one ordinarily skilled in the art that the present invention can be practiced without the specific details.

Figure 1:
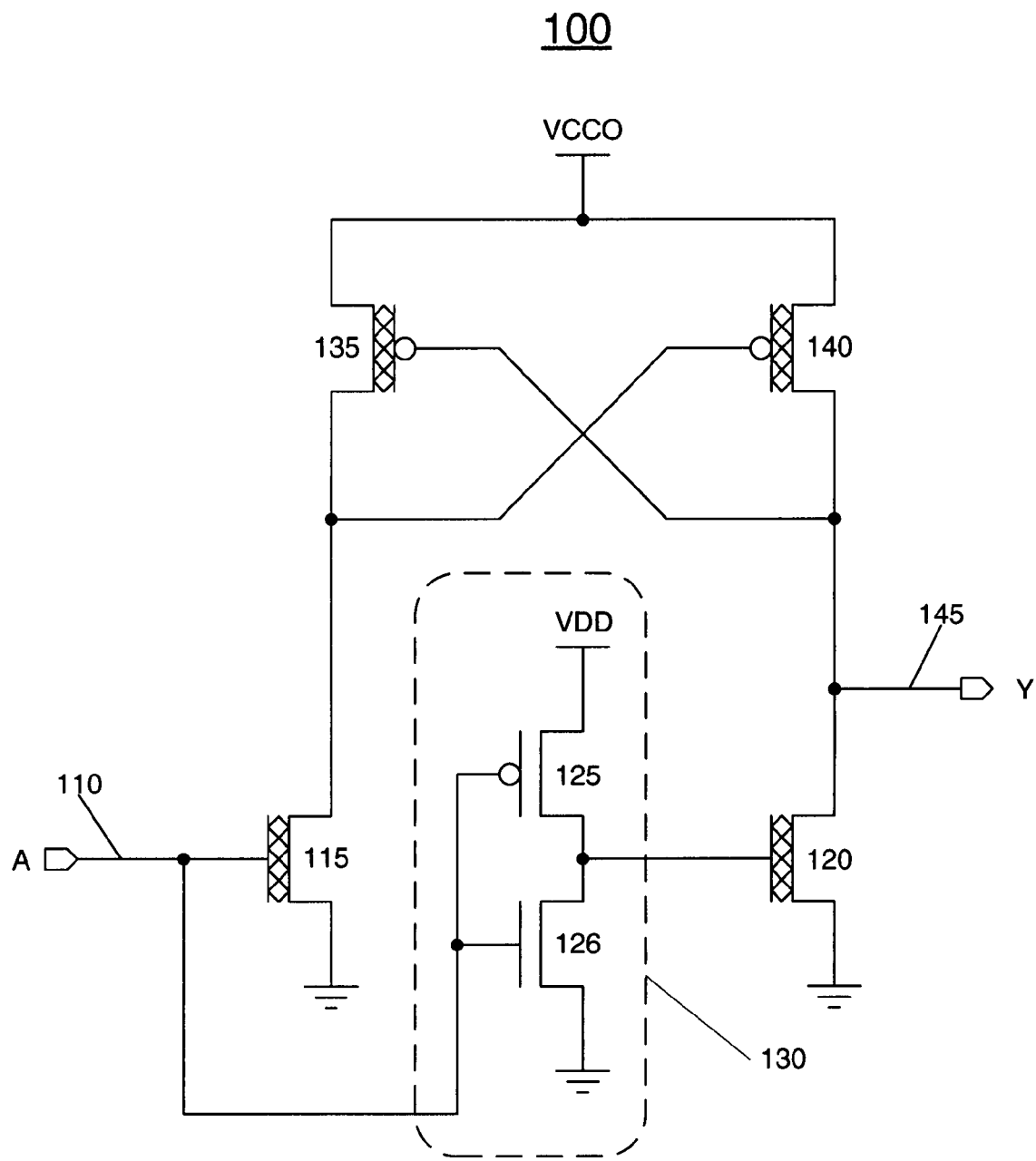
FIG. 1 illustrates an example of a typical level shifter.

FIG. 1 shows a circuit diagram of a typical level shifter 100. The level shifter 100 includes NMOS transistors 115 and 120, PMOS transistors 135 and 140, and inverter 130. Transistors 115, 120, 135, and 140 are thick oxide transistors, while transistors 125 and 126, which form the inverter 130, are thin oxide transistors. Their thicker gate oxide allows transistors 115, 120, 135, and 140 to tolerate the greater voltages that may be supplied by a high voltage supply.

The level shifter 100 shifts an input signal A at its input node 110, having an input voltage range of 0V to VDD, to an output signal Y at its output node 145, having an output voltage range of 0V to VCCO. For example, VDD supply can be 1.2V and VCCO supply can be 2.5V. A logic low at the input node 110, that may correspond to 0V, results in a logic low at output node 145, that may correspond to 0V. Logic high at the input node 110 that may correspond to a voltage of 1.2V, results in a logic high at the output node 145 that may correspond to a voltage of 2.5V.

A problem with the typical level shifter 100 shown, is that its performance can be highly dependent on many factors, including input signal voltage range, the multiple power supply voltage ranges, process variations, and frequencies of the input signals of the level shifter 100. For example, in the typical level shifter shown in FIG. 1, the size of each of transistors 115, 120, 135, and 140 is optimized for particular range of values of VDD and/or VCCO. This is necessary because PMOS transistors 135 and 140 may expect a gate-source voltage of VCCO (high voltage), while NMOS transistors 115 and 120 may expect a gate-source voltage of only VDD (lower voltage). The current drive or strength of a transistor depends in part on its gate-source voltage, so a designer would optimize a circuit based in part on the difference in gate-source voltages. In general, the size of the PMOS transistors in level shifter 100 affects the rise time (the time it takes for the output to transition from a logic low to a logic high), and the size of the NMOS transistors affects the fall time (the time for a transition from a logic high to a logic low). Additionally, since PMOS transistors 115 and 120 have thick oxide thickness, their Vts (threshold voltages) are relatively higher than core transistors having the thin oxide thickness. Devices having high Vt, such as 115 and 120, tend to be slower and harder to turn on when using normal core logic voltage range VDD-0V. In one example, the level shifter can be optimized such that its rise and fall times are substantially the same. If the voltage level of VDD is subsequently decreased (or VCCO is increased), the NMOS transistors weaken relative to the PMOS transistors, which means that the fall time at output 145 increases relative to the rise time. Increasing VDD relative to VCCO has the opposite effect.

Figure 2:
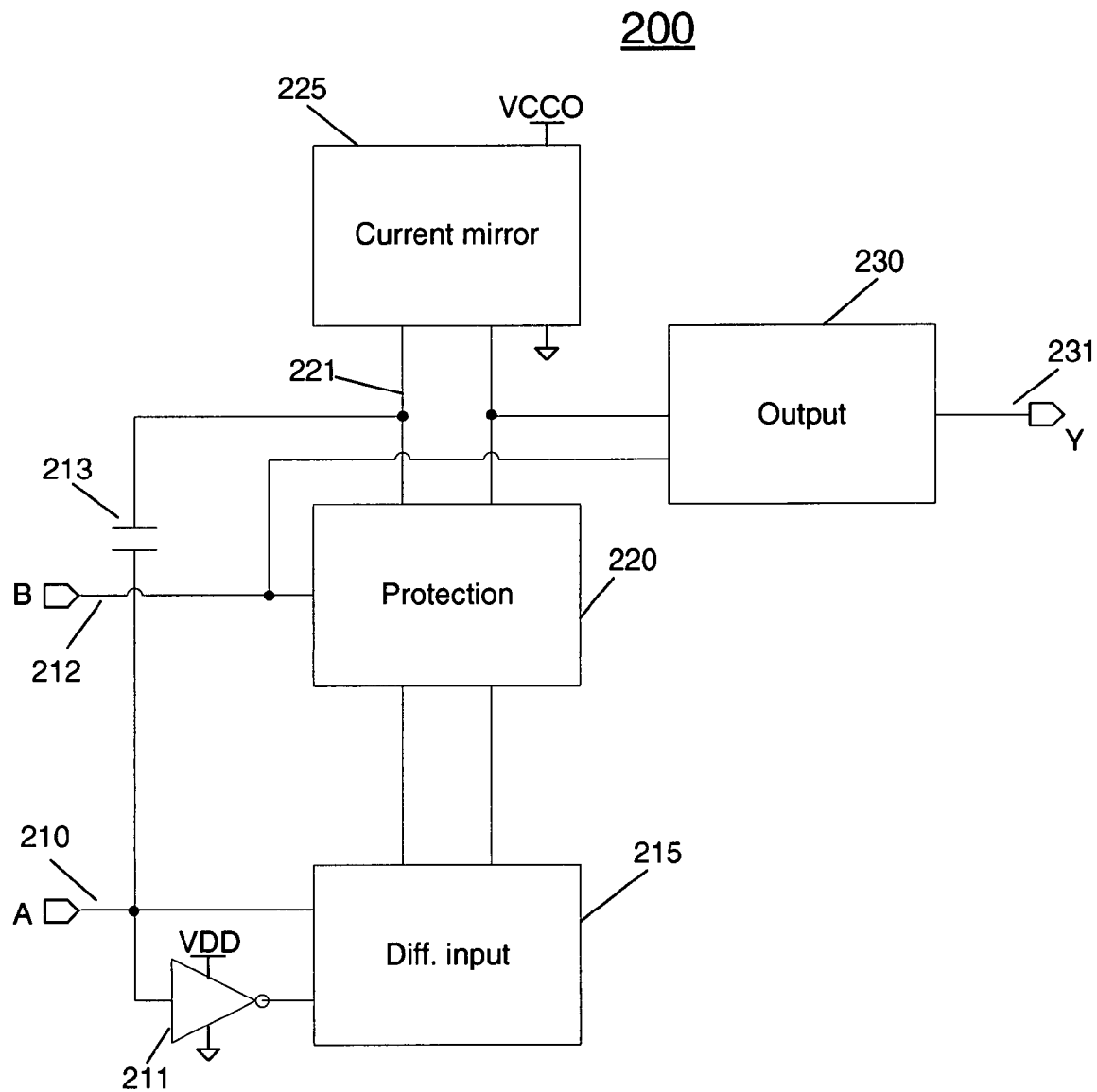
FIG. 2 illustrates a block diagram of a level shifter in accordance with an embodiment of the present invention.

FIG. 2 shows a block diagram of a level shifter 200 in accordance with an embodiments of the present invention. The level shifter 200 includes a differential input stage 215, a protection stage 220, a current mirror stage 225, and an output stage 230. The differential input stage 215 receives an input signal from input signal A, node 210, and a complement of the input signal. Inverter 211 may provide the complement of the input signal to the differential input stage 215. In another example, the differential input stage 215 may include the inverter 211. The inverter 211 may be powered by an internal or core power supply voltage VDD, and it may have transistors processed having a thin oxide thickness. Inverter 211 can receive input signal A, node 210, having a low voltage range VDD-0V. The differential input stage 215 may also include transistors processed having the thin oxide thickness. The input signal A at node 210 and the complement of the input signal have may also have the low voltage range VDD-0V.

The differential input stage 215 may be coupled to a protection stage 220. The protection stage 220 may act as a buffering stage or an isolation stage between the differential input stage 215 that includes the low voltage of the input signal A and the high voltage of the output stage 230. The protection circuit 220 may also be coupled to input signal B, node 212, where the input signal B can be a disable signal. In one example, circuit 200 may be disabled by asserting a voltage on the input signal B, where circuit 200 may be disabled by decoupling the differential input stage 215 from the output stage 230 and the current mirror stage 225. In another example, circuit 200 can be disabled or powered-down in a power saving mode.

The protection stage 220 may also be coupled to a current mirror stage 225. The current mirror stage 225 provides a current source to the two branches coupled to the protection stage 220, where branch may feed the output stage 230. The current mirror stage 225 may provide adequate current capability to maintain output switching performance characteristics. The output stage 230 has one input terminal coupled to a branch of the current mirror stage 225 and a second input terminal coupled to the input signal B, node 212. The level shift circuit 200 may be powered-down or disabled by having input signal B asserted.

The level shifter circuit 200 may also include a feed-forward capacitor 213 connected between node 210 and a branch 221 of the current mirror stage 225. The feed-forward capacitor 213 can maintain switching performance characteristics of the level shifter circuit 200. In one example, the feed-forward capacitor 213 may preserve the rise time, the fall time, and therefore, the duty cycle performance relationship between the input signal applied by input signal A, node 210 and the output signal Y, node 231.

Figure 3:
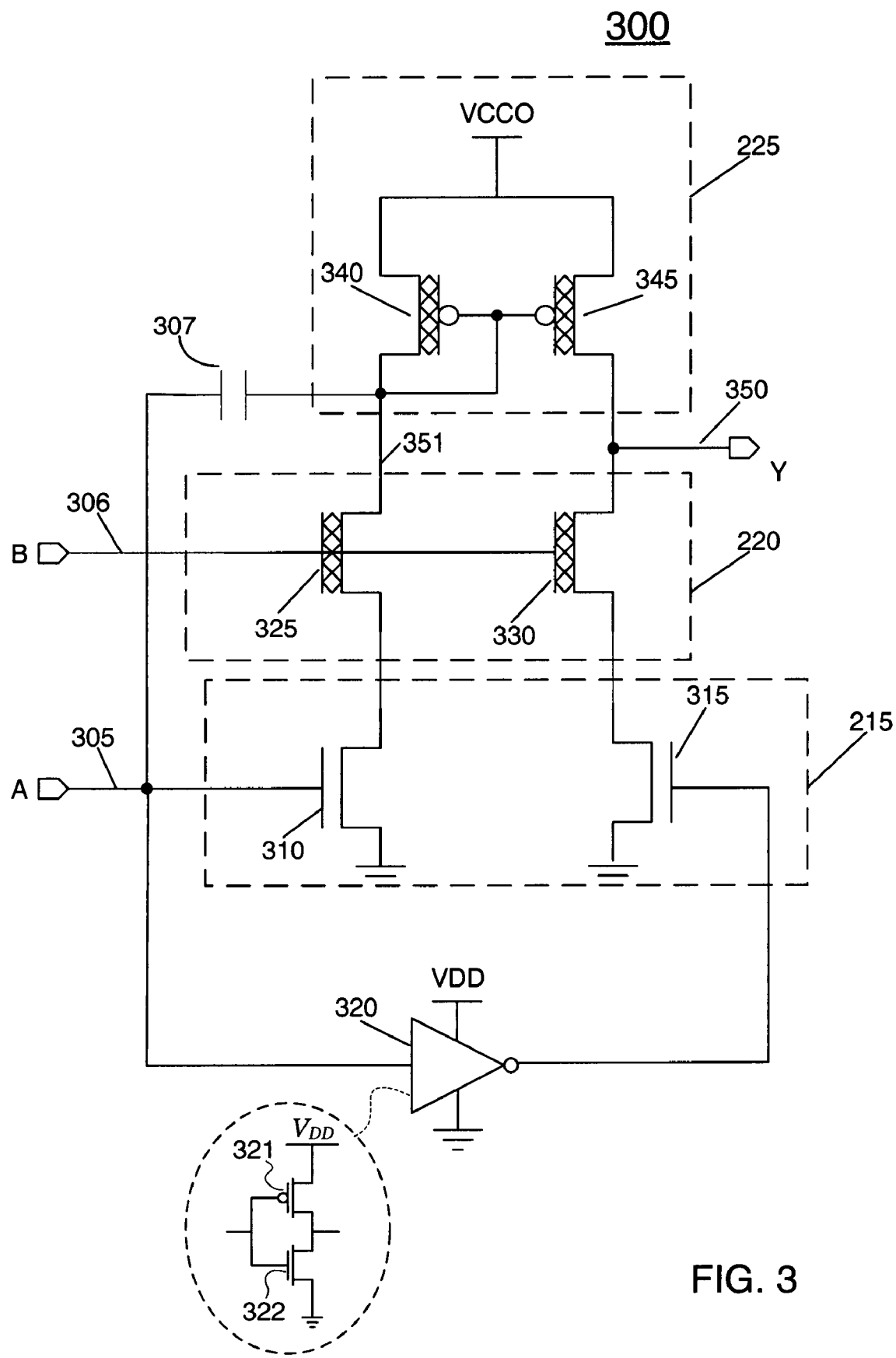
FIG. 3 illustrates circuit configuration of a level shifter in accordance with an embodiment of the present invention.

FIG. 3 illustrates a level shifter circuit 300, according to an embodiment of the present invention. FIG. 3 shows the differential input stage 215 including transistors 310 and 315. Transistors 310 and 315 are NMOS type, and may be fabricated having a first oxide thickness, where the first oxide thickness is a thin oxide thickness. Input signal A (node 305) may be coupled to the gate of transistor 310, and also coupled to the input of inverter 320. The inverter 320 is powered by a first voltage (VDD), and also may include transistors 321 and 322, a PMOS and NMOS respectively. Transistors 321 and 322 are processed having the thin oxide thickness. Inverter 320 receives the input signal A, where the input signal A may have a first voltage range or a voltage range VDD-low voltage. The low voltage in one embodiment of the present invention may be a ground potential or any voltage level associated with logic level zero (0V). The inverter 320 provides a complement of the input signal A, where the complement of the input signal may be coupled to the gate of transistor 315.

The differential input stage 215 may be coupled to the protection stage 220. The protection stage 220 may include protection transistors 325 and 330. Transistors 325 and 330 are NMOS type, and may be fabricated having a second oxide thickness, where the second oxide thickness is a thick oxide thickness. The protection stage 220 may also be coupled to input signal B (node 306), where input signal B may be a disable signal or a power-down signal, also input signal B may have 0V-VDD voltage range. In this instance, the input signal B is an active low signal and may be connected to gates of transistors 325 and 330. The level shifter circuit 300 may be disabled or powered-down by asserting (0V) at the input signal B, where transistors 325 and 330 may be turned off, therefore decoupling the input stage 215 from the current mirror stage 225 and the output Y (node 350). In one example, when input signal B is logic high (VDD), the level shifter circuit 300 may be active, the NMOS transistors 325 and 330 are turned on. When NMOS transistors 325 and 330 are turned on, they may each behave as if there is a short between its source and drain, meaning voltages and/or currents flow freely between the input stage 215 and the current mirror stage 225. Conversely, when input signal B is logic low (0V), the level shifter circuit 300 may be disabled, the NMOS transistors 325 and 330 are turned off and the input stage 215 may be de-coupled from the current mirror stage 225 and the output Y. When the level shifter 300 is disabled, the output Y may not respond to stimulus from input signal A.

The protection stage 220 may be connected to the current mirror stage 225. Transistors 340 and 345 are connected to form a current mirror. In this configuration, the current flowing through transistor 340, multiplied by a constant factor, and may be "mirrored" over to transistor 345. That is, the current through transistor 345 is a fixed multiple of the current through transistor 340. This constant multiplier is a function of the relative sizes of transistors 340 and 345. For example, if transistor 345 is twice as wide as transistor 340, then the current flowing through transistor 345 is approximately twice the current flowing through transistor 340. In accordance with one embodiment the present invention, other current mirror configurations may be used and they are well known to those of ordinary skill in the art. Transistors 340 and 345 may be coupled to a second supply, VCCO, or a second voltage, where the VCCO supply may be greater in magnitude than the voltage of the VDD supply. The output Y (node 350) may have a second voltage range or a voltage range VCCO-low voltage, where the low voltage may be the ground potential (0V).

Circuit 300 may also include a capacitor 307 coupled between the node 350 and the drain of transistor 340 (node 351). The capacitor 307 may also be referred to as a feedforward capacitor. Capacitor 307 may maintain switching performance characteristic of the output Y in reference to the input signal A (node 305). Capacitor 307 may also enable the output Y (node 350) to better track the rise time and fall time of the input signal A, therefore the duty cycle of the output signal 350 may be similar to the duty cycle of the input signal A. Rise time, fall time, and duty cycle performance may be more relevant at I/O signals operating at higher frequencies. In general, at higher frequencies a signal may have a faster rise time and fall time, maintaining the rise time and fall time may be an important factor for maintaining the duty cycle and therefore, the overall performance of the IC. Capacitor 307 may be an important element for maintaining performance of the level shifter circuit 300 over a wide range of frequencies, and especially at higher frequencies.

In one example, level shifter circuit 300 may function in the following manner: When input signal B (node 306) is at a logic high (VDD), meaning the level shifter can be enabled, and input A (node 305) is a logic low (0V), transistor 310 is turned off and the output of inverter 320 is a logic high (VDD). Applying VDD voltage to the gate of transistor 315 may turn on transistor 315, which pulls the output Y to a logic low (0V). Conversely, when input signal A is a logic high (VDD), transistor 315 is turned off and transistor 310 is turned off, which pulls the gate of transistor 345 logic low (0V). This turns on PMOS transistor 345, which then pulls the output Y to a logic high (VCCO).

In an embodiment where the size ratio between transistors 340 and 345 is substantially the same as the size ratio between transistors 310 and 315, the rise time will be substantially the same as the fall time. For example, if transistor 345 is twice as wide as transistor 340, then transistor 315 is sized to be twice as wide as transistor 310. The rise and fall times are approximately equal since NMOS transistor 315, which turns on when input A (and therefore, output Y) transitions from a logic high to a logic low, controls the fall time, and NMOS transistor 310, which turns on when input signal A transitions from a logic low to a logic high, controls the rise time. When the size ratios between the PMOS and NMOS transistors are equal, the relative drive strength of transistor 315 compared to transistor 310 is equal to the constant multiplier of the current mirror, thereby ensuring that the rise time and the fall time are approximately equal. Equal rise and fall times ensure good duty cycle performance.

In one embodiment, transistor 340 is specifically matched to transistor 345, and transistor 310 is specifically matched to transistor 315, thereby further improving tolerance to voltage and process variations. For example, each matched transistor pair can have finger structures physically close and produced using the same process steps, only varying in the number of fingers. In such an example, transistor 345 can have eight fingers and transistor 340 can have four fingers for a 2:1 ratio. Matching the transistor pairs can minimize the effects of spatial and geometric variations on an IC. Also, other transistor ratios are possible, as is apparent to a person skilled in the art.

In one embodiment of the present invention, the protection circuit 220 of circuit 300 isolates the transistors operating at low voltage levels, meaning transistors 310 and 315 which may have VDD-0V voltage range, from transistors operating at higher voltage levels (e.g., VCCO-0V), such as transistors 340 and 345 which may have VCCO-0V voltage range. Therefore, the protection circuit 220 may allow the level shifter circuit 300 to operate at very wide signal ranges. The differential input stage 215 may have very low supply voltage range and very low input signal range, meaning VDD may have a very low voltage, due to the thin oxide devices used, such as transistors 310 and 315. Also, due to the thin oxide thickness used in transistors 310 and 315 of the input stage 215 of circuit 300, switching transistors 310 and 315 to turn on or turn off can be accomplished relatively fast, meaning that the input stage 215 may be suitable for very high frequency applications that may extend to 1 Giga Hertz and beyond. The output signal 350 may have a high voltage range, meaning output signal 350 may have VCCO-0V output voltage range. Therefore, the level shifter circuit 300 has an advantage of supporting a very wide frequency ranges and can tolerate a very wide I/O signal voltage ranges. Also, the level shifter circuit 300 may be an area efficient design that may be used in an area sensitive integrated circuits (ICs), or in ICs where many of these level shifters are needed. One example of an IC using many level shifter circuits may be a programmable logic device (PLD) having programmable resources, where hundreds or even thousands of level shifter circuits may be used to accommodate the various I/O standards and/or the various voltage supply ranges, internally and/or externally. One example may include the level shifter circuits coupled between the programmable resources.

Figure 4:
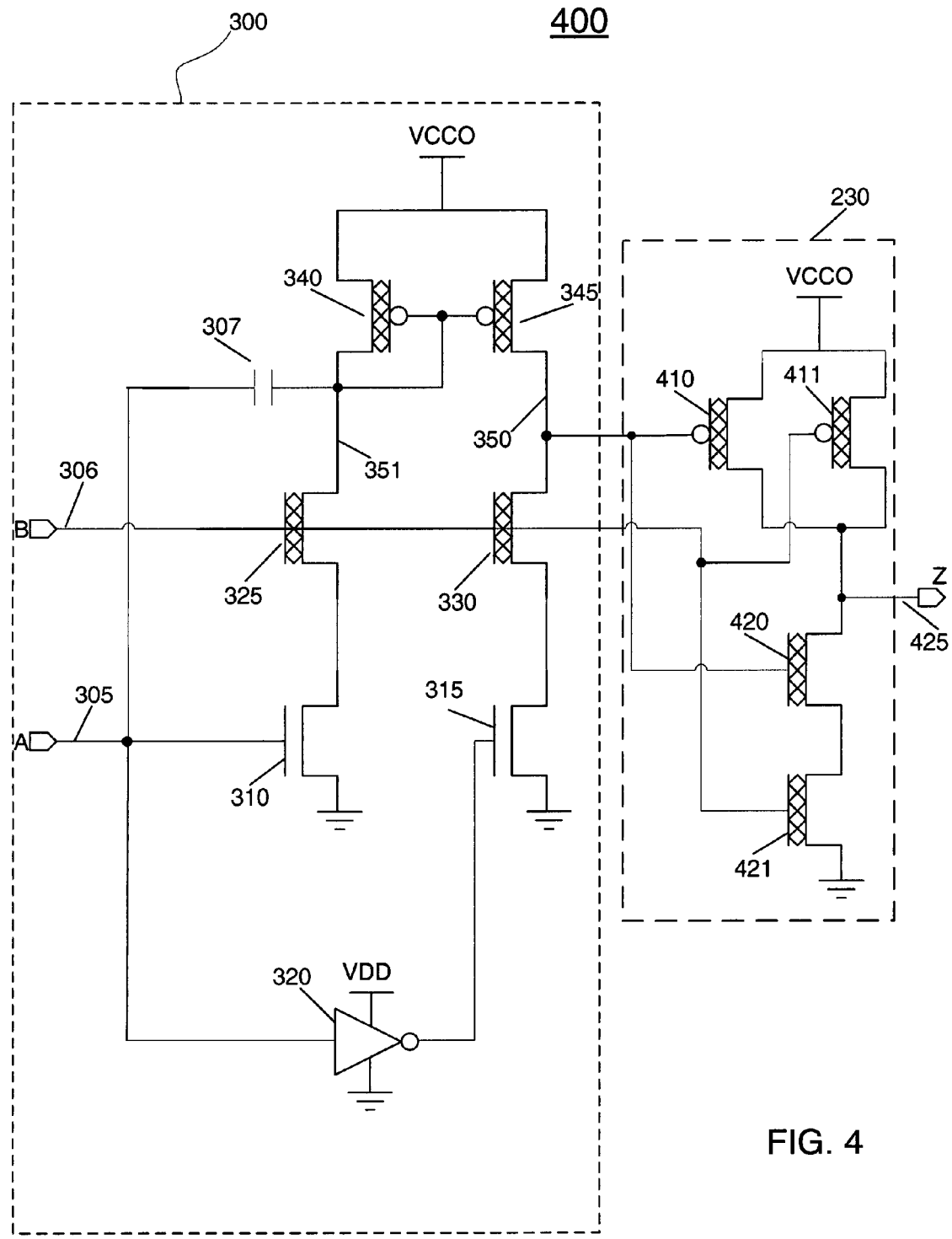
FIG. 4 illustrates circuit configuration of a level shifter including an output stage in accordance with an embodiment of the present invention.

FIG. 4 shows a level shifter circuit 400 having an output stage 230. In one embodiment of the present invention, the output stage 230 may be a NAND gate. Other output stage configurations may be possible, as is apparent to a person skilled in the art. The level shifter circuit 400 includes circuit 300 and circuit 230, as shown in FIG. 4. Detailed explanation of circuit 300 was previously discussed in the above sections. In an example, the output stage 230 may have two inputs. A first input can be coupled to input signal B (node 306), and a second input can be coupled to the drain of transistor 345. For instance, the input signal B is asserted, i.e., logic level low (0V), transistor 421 is turned off and transistor 411 is turned on. This may force the output signal Z (node 425) of the output stage 230 to be driven logic level high (VCCO). Conversely, If input signal B is de-asserted, i.e., logic level high (VDD), this may force transistor 421 to turn on and transistor 411 turn off. Therefore, the output Z (node 425) may be responsive to the input signal A (node 305).

Figure 5:
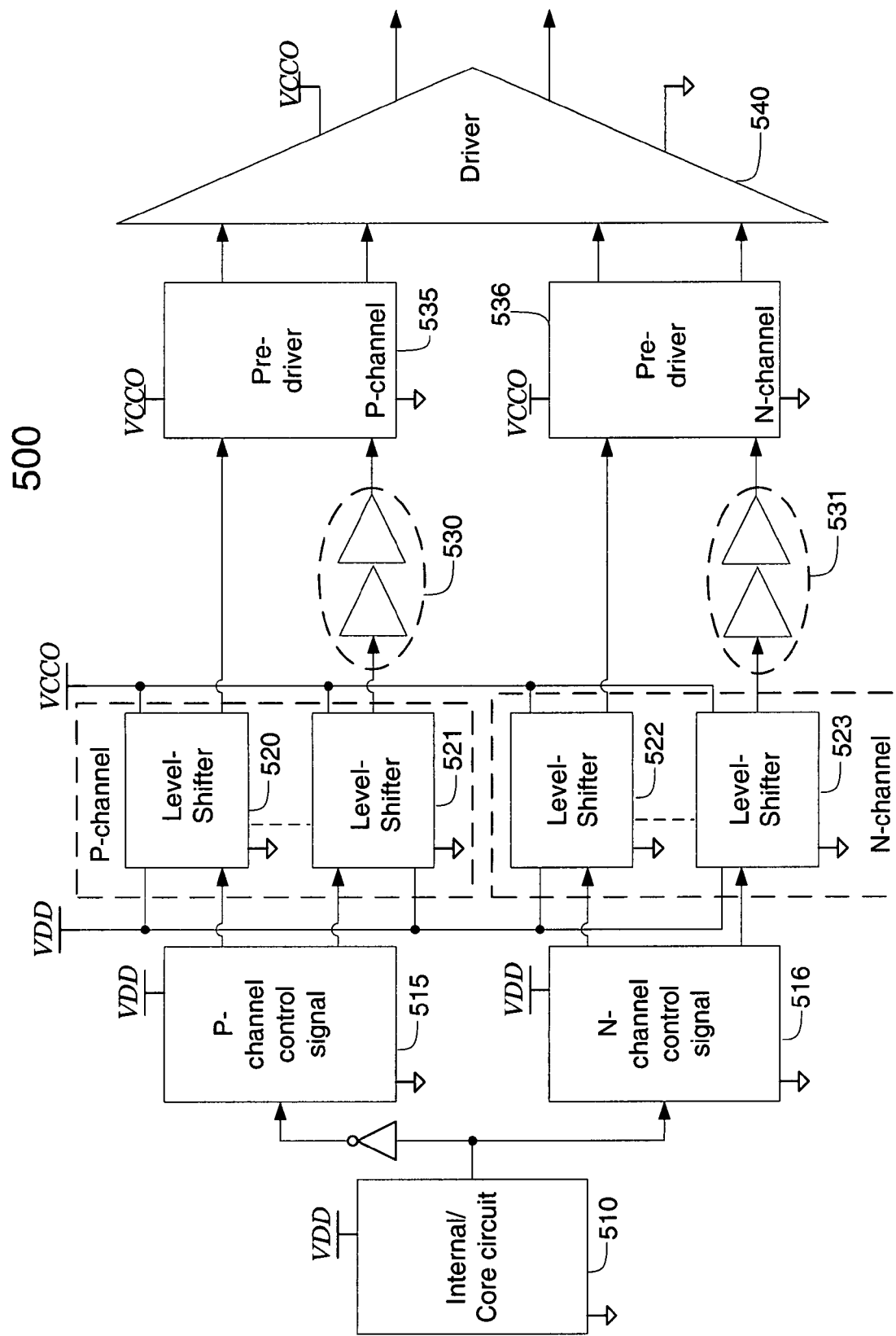
FIG. 5 illustrates block diagram of an output driver including multiple level shifter circuits in accordance with an embodiment of the present invention.

Circuit 500 is an example of an output driver circuit including multiple level shifters, according to an embodiment of the present invention. Circuit 510 cab be a core circuit, performing a function according to a design specification. Circuit 510 may be powered by a voltage supply having a VDD voltage. Circuits 515 and 516 are control circuits powered the VDD voltage. Circuits 515 and 516 provide output signals having VDD-0V voltage range that may be coupled to multiple level shifter circuits 520-523. In an example circuit 500 may require multiple level shifter circuits 520-523. Circuits 520-523 may be identical in construction, but may be coupled to various circuits to add flexibility in complying with the many I/O standards. For instance, level shifter 521 may be coupled to a delay circuit 530, while level shifter 520 is directly coupled to a pre-driver circuit 535. Similarly, level shifters 522 and 523, that may be couple to pre-driver circuit 536 and delay circuit 531 respectively. FIG. 5 shows the pre-driver circuits may be coupled to driver circuit 540.

Circuit 500 may be implemented in a PLD, where the PLD may require hundreds or more of the level shifter circuits to be used in supporting the plethora of I/O standards and/or I/O signals having various voltage ranges. One example of an I/O block supporting multiple standards is described in U.S. Pat. No. 6,693,218 "Bi-Directional Interface and Communication Link" by Mark A. Alexander et al., which is hereby incorporated by reference in its entirety.

Further, capacitors, pull-ups, pull downs, transistors; P-channel transistors, N-channel transistors, biasing circuits, oscillators, clock dividers, and other components other than those described herein can be used to implement the invention. For instance, transistors 325 and 330 may be PMOS devices in some embodiments. Transistor and non-transistor devices may be built with parametric sensitivity and with parametric-insensitivity that permit implementation of the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps.

What is claimed is:

1. A level shifter circuit for shifting an input signal having a first voltage range that extends from a low voltage to a first voltage, to an output signal having a second voltage range that extends from the low voltage to a second voltage, wherein the first voltage is different from the second voltage, the level shifter circuit comprising:
   an inverter powered by the first voltage, wherein the inverter is coupled to provide a complement of the input signal;
   a differential input stage receiving the input signal and the complement of the input signal,
   wherein the complement of the input signal has the first voltage range;
   a current mirror stage powered by the second voltage and generating the output signal of the level shifter circuit;
   a protection stage coupled between the differential input stage and the current mirror stage,
   wherein the protection stage is disabled based on a disable signal, and
   wherein the protection stage includes at least one transistor fabricated having a thick oxide thickness;
   wherein the protection stage comprises:
      a first protection transistor having a source, a drain, and a gate, wherein the gate of the first protection transistor is coupled to the disable signal, and
      a second protection transistor having a source, a drain, and a gate, wherein the gate of the second protection transistor is coupled to the disable signal;
   wherein the differential input stage comprises:
      a third transistor having a source, a drain, and a gate, wherein the source of the third transistor is coupled to the low voltage, the gate of the third transistor is coupled to the input signal, and the drain of the third transistor is coupled to the source of the first protection transistor, and
      a fourth transistor having a source, a drain, and a gate, wherein the source of the fourth transistor is coupled to the low voltage, the gate of the fourth transistor is coupled to the complement of the input signal, and the drain of the fourth transistor is coupled to the source of the second protection transistor; and
   a capacitor coupled between the gate of the third transistor and the drain of the first protection transistor.

2. The level shifter circuit of claim 1, wherein the first and second protection transistors are fabricated as NMOS transistors having the thick oxide thickness.

3. The level shifter circuit of claim 1, wherein the third and the fourth transistors are NMOS transistors having a thin oxide thickness.

4. The level shifter circuit of claim 3, wherein the inverter comprises transistors having the thin oxide thickness.

5. The level shifter circuit of claim 1, wherein the current mirror stage comprises:
   a fifth transistor having a source, a drain, and a gate, wherein the drain of the fifth transistor is coupled to the drain of the first protection transistor, the source of the fifth transistor is coupled to the second voltage, and the gate of the fifth transistor is coupled to the drain of the first protection transistor; and
   a sixth transistor having a source, a drain, and a gate, wherein the drain of the sixth transistor is coupled to the drain of the second protection transistor, the source of the sixth transistor is coupled to the second voltage, and the gate of the sixth transistor is coupled to the gate of the third transistor.

6. The level shifter circuit of claim 5, wherein the fifth and sixth transistors are PMOS transistors having the thick oxide thickness.

7. The level shifter circuit of claim 1, wherein the second voltage is greater than the first voltage.

8. The level shifter circuit of claim 1, wherein the second voltage range is greater than the first voltage range.

9. A programmable logic device, comprising:
   programmable resources; and
   a level shifter selectively coupled to the programmable resources, comprising:
      a current mirror circuit powered by a first voltage;
      a differential input circuit;
      a protection circuit coupled between the current mirror circuit and the differential input circuit;
      an input terminal coupled to a first control of the differential input circuit;

a capacitor coupled between the input terminal and a second branch of the current mirror circuit;

an inverter coupled between the input terminal and a second control of the differential input circuit, wherein the inverter is powered by a second voltage;

a disable terminal coupled to a control input of the protection circuit; and an output circuit having inputs coupled to a first branch of the current mirror circuit and the disable terminal, wherein the protection circuit includes at least one transistor having a thick oxide thickness, and wherein the protection circuit is disabled by asserting a disable signal at the disable terminal.

10. The programmable logic device of claim 9, wherein the current mirror circuit has at least one transistor having the thick oxide thickness.

11. The programmable logic device of claim 9, wherein the differential input circuit has at least one transistor having a thin oxide thickness.

12. The programmable logic device of claim 9, wherein the first voltage is greater than the second voltage.

13. The programmable logic device of claim 9, wherein the programmable logic device comprises plurality of level shifters coupled to the programmable resources, and wherein the level shifter is coupled between core circuit and output driver of the PLD.

14. The programmable logic device of claim 9, wherein the output terminal has a first voltage range and the input terminal has a second voltage range, and wherein the first voltage range is greater than the second voltage range.

15. A level shifter circuit for shifting an input signal having a first voltage range that extends from a low voltage to a first voltage, to an output signal having a second voltage range that extends from the low voltage to a second voltage, wherein the first voltage is different from the second voltage, the level shifter circuit comprising:

an inverter powered by the first voltage, wherein the inverter is coupled to provide a complement of the input signal;

a differential input stage receiving the input signal and the complement of the input signal, wherein the complement of the input signal has the first voltage range;

a current mirror stage powered by the second voltage and generating the output signal of the level shifter circuit on a first branch of the current mirror stage;

a protection stage coupled between the differential input stage and the current mirror stage; and a capacitor coupled between an input of the differential input stage and a second branch of the current mirror stage.

16. An integrated circuit, comprising:

a current mirror circuit powered by a first voltage;

a differential input circuit;

a protection circuit coupled between the current mirror circuit and the differential input circuit;

a disable terminal coupled to the protection circuit;

an input terminal coupled to a first control of the differential input circuit;

an inverter coupled between the input terminal and a second control of the differential input circuit, wherein the inverter is powered by a second voltage;

an output circuit having inputs coupled to a first branch of the current mirror circuit and the disable terminal; and a capacitor coupled between the input terminal and a second branch of the current mirror circuit.

* * * * *